(12) United States Patent
Kim

(10) Patent No.: US 8,797,814 B2
(45) Date of Patent: Aug. 5, 2014

(54) MULTI-TEST APPARATUS AND METHOD FOR TESTING A PLURAILTY OF SEMICONDUCTOR CHIPS

(75) Inventor: Dae-Suk Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 230 days.

(21) Appl. No.: 13/333,487

(22) Filed: Dec. 21, 2011

(65) Prior Publication Data

US 2012/0275246 A1    Nov. 1, 2012

(30) Foreign Application Priority Data

Apr. 26, 2011    (KR) .................... 10-2011-0039074

(51) Int. Cl.
*G11C 7/00* (2006.01)
*G11C 29/00* (2006.01)

(52) U.S. Cl.
USPC .. 365/201; 365/226; 365/230.04; 365/230.06

(58) Field of Classification Search
USPC .......... 365/189.05, 230.03, 201, 226, 230.04, 365/230.06
See application file for complete search history.

(56) References Cited

U.S. PATENT DOCUMENTS

| 6,262,928 | B1 * | 7/2001 | Kim et al. ................. | 365/201 |
| 6,480,435 | B2 * | 11/2002 | Nakamura et al. ............ | 365/207 |
| 6,502,214 | B1 * | 12/2002 | Pyeon ........................ | 714/718 |
| 7,136,315 | B2 * | 11/2006 | Kang ......................... | 365/201 |
| 7,751,232 | B2 * | 7/2010 | Lee et al. ................... | 365/163 |
| 8,422,323 | B2 * | 4/2013 | Yang .......................... | 365/201 |
| 8,456,931 | B2 * | 6/2013 | Ku ........................... | 365/189.16 |
| 2006/0233035 | A1 * | 10/2006 | Ishikawa .................... | 365/219 |
| 2007/0211546 | A1 * | 9/2007 | Song et al. .................. | 365/201 |

FOREIGN PATENT DOCUMENTS

| JP | 2002-168903 | 6/2002 |
| KR | 1020040020143 | 3/2004 |
| KR | 1020060054611 | 5/2006 |
| KR | 1020060092276 | 8/2006 |

OTHER PUBLICATIONS

Office Action issued by the Korean Intellectual Property Office on Jun. 25, 2012.
Notice of Allowance issued by the Korean Intellectual Property Office on Apr. 4, 2013.

* cited by examiner

*Primary Examiner* — Vanthu Nguyen
(74) *Attorney, Agent, or Firm* — IP & T Group LLP

(57) ABSTRACT

An apparatus and method is capable of reducing instantaneously consumed current by allowing write drivers and input buffers not to be simultaneously driven in a multi-test of semiconductor chips. A multi-test apparatus includes an input unit configured to receive data for testing, wherein the data for testing is inputted from a circuit outside of the multi-test apparatus, a plurality of memory banks each including a plurality of memory cells, a plurality of write drivers, corresponding to the respective memory banks, configured to write the test data in the plurality of memory banks, and a write control unit configured to control the plurality of write drivers so that the test data is written in the memory banks in at least two time periods.

9 Claims, 8 Drawing Sheets

MULTI-TEST APPARATUS AND METHOD FOR TESTING A PLURAILTY OF SEMICONDUCTOR CHIPS

CROSS-REFERENCE TO RELATED APPLICATIONS

The present application claims priority of Korean Patent Application No. 10-2011-0039074, filed on Apr. 26, 2011, which is incorporated herein by reference in its entirety.

BACKGROUND

1. Field

Exemplary embodiments of the present invention relate to a test of semiconductor chips, and more particularly, to an apparatus and method for simultaneously testing a plurality of chips.

2. Description of the Related Art

A multi-test for connecting a plurality of semiconductor chips (e.g., a few tens to a few hundreds of semiconductor chips) to one piece of test equipment and testing the chips is performed in semiconductor fields. Data for testing is provided from the test equipment. The provided test data is simultaneously written in memory cells of a plurality of memory banks included in each of the chips. The presence of a defect of the chips can be checked by simultaneously reading the data written as described above.

Since the multi-test is simultaneously performed with respect to a plurality of banks, write drivers provided corresponding to the respective banks and input buffers provided in a chip are driven at the same time. As the write drivers and the input buffers are simultaneously driven as described above, instantaneous current consumption may be increased, and an excessive load may be applied to the test equipment. Therefore, a method that reduces current consumption in a multi-test of semiconductor chips may be useful.

SUMMARY

An embodiment of the present invention is directed to an apparatus and method capable of reducing instantaneously consumed current by not simultaneously driving write drivers and input buffers in a multi-test of semiconductor chips.

In accordance with an embodiment of the present invention, a multi-test apparatus includes an input unit configured to receive data for testing, wherein the data for testing is inputted from a circuit outside of the multi-test apparatus; a plurality of memory banks each including a plurality of memory cells; a plurality of write drivers, corresponding to the respective memory banks, configured to write the test data in the plurality of memory banks; and a write control unit configured to control the plurality of write drivers so that the test data is written in the memory banks in at least two time periods.

In accordance with an embodiment of the present invention, a multi-test apparatus includes a plurality of memory banks each including a plurality of memory cells; a plurality of write drivers corresponding to the respective memory banks; an input unit configured to receive first data for testing and provide the received first data to the plurality of write drivers, wherein the first data for testing is inputted from a circuit outside of the multi-test apparatus; and an internal data generation unit configured to provide second test data substituting for the first test data to the plurality of write drivers in different time periods in response to a test control signal so that the second test data is written in the memory banks in at least two time periods, wherein the second test data is generated within the internal data generation unit.

In accordance with still another embodiment of the present invention, a test method of a multi-test apparatus including receiving first test data inputted from test equipment and providing the received first test data to a plurality of write drivers; blocking the first test data from being provided to the plurality of write drivers in response to a test control signal; and generating and providing second test data to the plurality of write drivers in at least two time periods in response to the test control signal so that the second test data is written in memory banks corresponding to the respective write drivers in the at least two time periods.

DETAILED DESCRIPTION

Figure 1:
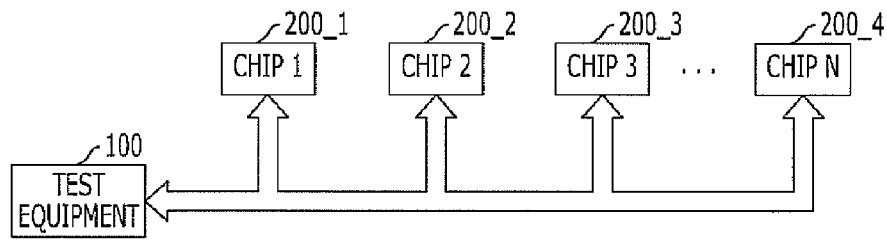
FIG. 1 illustrates a concept of a multi-test operation.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 illustrates a concept of a multi-test operation. A plurality of semiconductor chips (e.g., a few tens to a few hundreds of semiconductor chips) 200_1 to 200_4 are connected to one piece of test equipment 100, and a multi-test for the semiconductor chips 200_1 to 200_4 is performed. For the purpose of the multi-test, test data is provided from the test equipment 100. The semiconductor chips 200_1 to 200_4 receive the provided test data through a data pad (DQ) and write the received test data in memory cells of the plurality of memory banks (e.g., 8 memory banks). Subsequently, the test equipment 100 checks the presence of an abnormality of the semiconductor chips 200_1 to 200_4 by simultaneously reading the data written in the semiconductor chips 200_1 to 200_4.

First Embodiment

Figure 2:
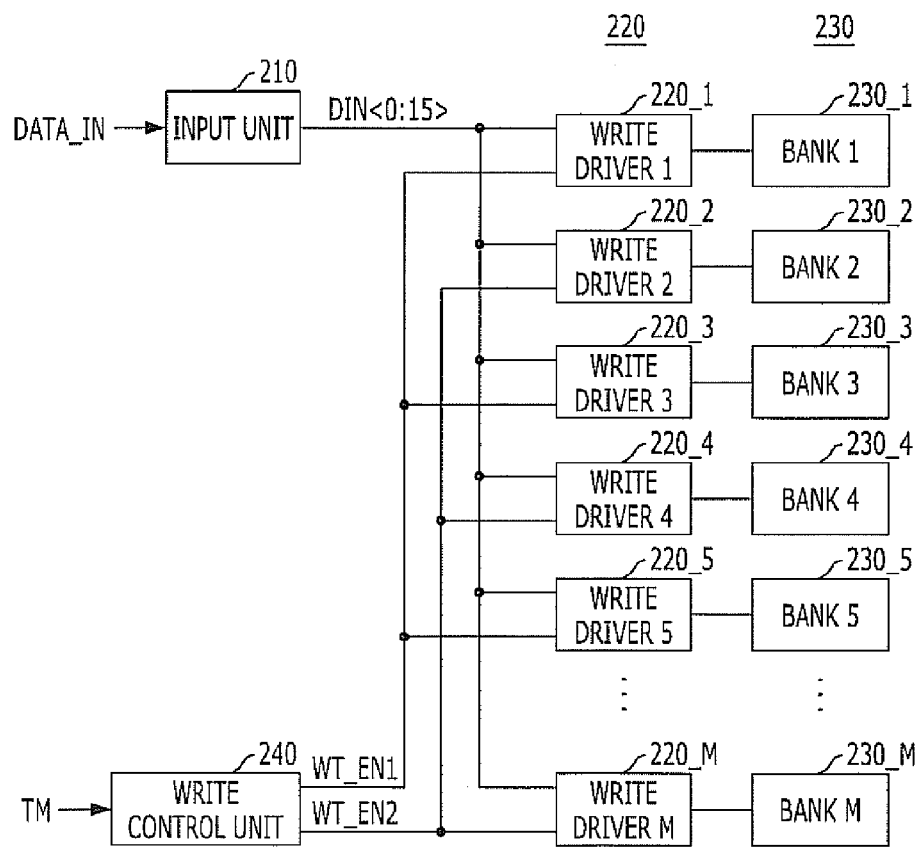
FIG. 2 illustrates a block configuration of a multi-test apparatus in accordance with an embodiment of the present invention.

FIG. 2 illustrates a block configuration of a multi-test apparatus in accordance with an embodiment of the present invention, which is a configuration included inside of each of the semiconductor chips 200_1 to 200_4 illustrated in FIG. 1. Each of the plurality of semiconductor chips 200_1 to 200_4 includes an input unit 210, a plurality of write drivers 220, a plurality of memory banks 230, and a write control unit 240.

The input unit 210 receives data DATA_IN for testing, inputted from the test equipment 100 (illustrated in FIG. 1) and outputs test data DIN<0:15> to the plurality of write drivers 220. The input unit 210 includes an input buffer of a general semiconductor chip and receives the test data DATA_IN through a data pad DQ The plurality of memory banks 230 include memory banks 230_1 to 230_M, and each of the memory banks 230_1 to 230_M includes a plurality of memory cells (not shown). The plurality of write drivers 220 include write drivers 220_1 to 220_M. The write drivers 220_1 to 220_M correspond to the respective memory banks 230_1 to 230_M and control the test data DIN<0:15> to be written in the memory banks 230_1 to 230_M by driving the memory banks 230_1 to 230_M, respectively.

The write control unit 240 controls the write drivers 220_1 to 220M so that the test data DIN<0:15> is divided in two or more time periods and written in the memory banks 230_1 to 230_M in response to a test control signal TM. For example, the write control unit 240 generates a first write enable signal WT_EN1 and a second write enable signal WT_EN2 in response to the test control signal TM for the purpose of controlling the write drivers 220_1 to 220_M so that the test data DIN<0:15> is divided in two time periods and written in the memory banks 230_1 to 230_M.

The write control unit 240 drives and controls write drivers 220_1, 220_3, 220_5, . . . , 220_M−1 in a first group among the write drivers 220_1 to 220_M by generating the first write enable signal WT_EN1 in a first time period T1 so that the test data DIN<0:15> is written in memory banks 230_1, 230_3, 230_5, . . . , 230_M−1 in a first group, corresponding to the write drivers 220_1, 220_3, 220_5, . . . , 220_M−1 in the first group, among the memory banks 230_1 to 230_M. The write control unit 240 drives and controls write drivers 220_2, 220_4, . . . , 220_M in a second group among the write drivers 220_1 to 220_M by generating the second write enable signal WT_EN2 in a second time period T2 different from the first time period T1 so that the test data DIN<0:15> is written in memory banks 230_2, 230_4, . . . , 230_M in a second group, corresponding to the write drivers 220_2, 220_4, . . . , 220_M in the second group, among the memory banks 230_1 to 230_M.

As described above, the memory banks in the first group may be odd-numbered memory banks 230_1, 230_3, 230_5, . . . , 230_M−1, and the memory banks in the second group may be even-numbered memory banks 230_2, 230_4, . . . , 230_M. Alternatively, the memory banks in the first or second group may be specified as memory banks having a designated number (e.g., M/2) among the total of M memory banks.

Figure 3:
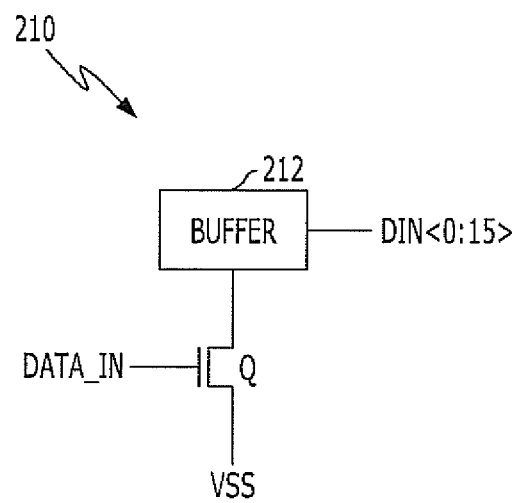
FIG. 3 illustrates a detailed configuration of an input unit illustrated in FIG. 2.

FIG. 3 illustrates a detailed configuration of the input unit 210 illustrated in FIG. 2. The input unit 210 includes a buffer 212 and a transistor Q. The transistor Q is implemented as an NMOS transistor and has a gate terminal that receives test data DATA_IN, a source terminal connected to a ground voltage terminal VSS, and a drain terminal connected to the buffer 212. The buffer 212 receives the test data DATA_IN provided by the drain terminal of the transistor Q and buffers the received test data DATA_IN. Subsequently, the buffer 212 outputs the buffered test data DATA_IN as test data DIN<0:15> to be provided to the write drivers 220_1 to 220_M.

Figure 4:
FIG. 4 illustrates a detailed configuration of write drivers illustrated in FIG. 2.

FIG. 4 illustrates a detailed configuration of the write drivers 220_1 to 220_M illustrated in FIG. 2. Each of the write drivers 220_1 to 220_M receives the test data DIN<0:15> provided from the input unit 210. Each of the write drivers 220_1 to 220_M is driven in response to the write enable signal WT_EN1 or WT_EN2 provided from the write control unit 240. The write drivers 220_1 to 220_M provide the received test data DIN<0:15> to the respective memory banks 230_1 to 230_M through data lines LIOT and LIOB.

Figure 5:
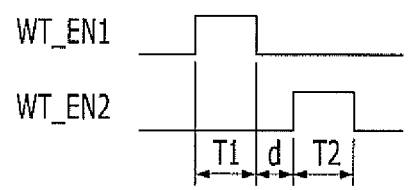
FIG. 5 is a timing diagram illustrating an operation that generates a write enable signal of a write control unit illustrated in FIG. 2.

FIG. 5 is a timing diagram illustrating an operation that generates a write enable signal of the write control unit 240 illustrated in FIG. 2. The write control unit 240 generates a first write enable signal WT_EN1 in a first time period T1, and generates a second write enable signal WT_EN2 in a second time period T2 after a certain time d elapses after the end of the first time period T1.

Figure 6:
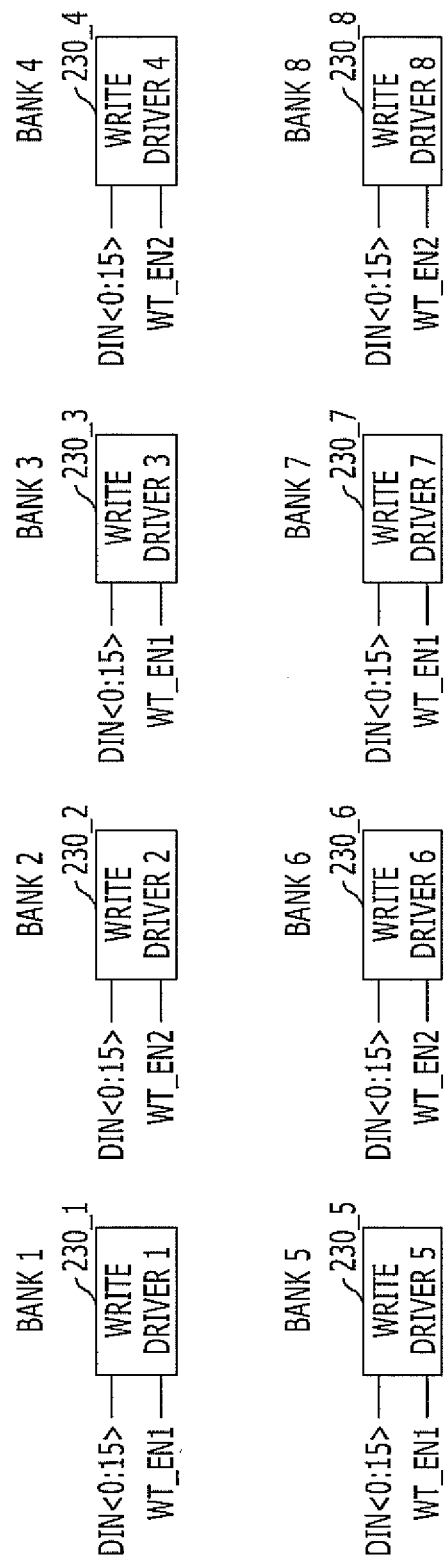
FIG. 6 illustrates memory banks that are selectively driven in a multi-test in accordance with the embodiment of the present invention.

FIG. 6 illustrates memory banks that are selectively driven in a multi-test in accordance with the embodiment of the present invention. The write drivers 220_1, 220_3, 220_5, . . . , 220_M−1 in the first group among the write drivers 220_1 to 220_M are driven in response to the first write enable signal WT_EN1 in the first time period T1. The write drivers 220_1, 220_3, 220_5, . . . , 220_M−1 in the first group control the test data DIN<0:15> to be written in the memory banks 230_1, 230_3, 230_5, . . . , 230_M−1 in the first group, respectively corresponding to the write drivers 220_1, 220_3, 220_5, . . . , 220_M−1 in the first group among the memory banks 230_1 to 230_M.

Among the write drivers 220_1 to 220_M, the write drivers 220_2, 220_4, . . . , 220_M in the second group are driven in response to the second write enable signal WT_EN2 in the second time period T2. The write drivers 220_2, 220_4, . . . , 220_M in the second group control the test data DIN<0:15> to be written in the memory banks 230_2, 230_4, . . . , 230_M in the second group, respectively corresponding to the write drivers 220_2, 220_4, . . . , 220_M in the second group among the memory banks 230_1 to 230_M. For example, the memory banks 230_1, 230_3, 230_5, . . . , 230_M−1 in the first group may be odd-numbered memory banks, and the memory bank 230_2, 230_4, . . . , 230_M in the second group may be even-numbered memory banks.

Thus, the multi-test apparatus in accordance with this embodiment the write drivers are not simultaneously driven in the multi-test of the semiconductor chips, so that instantaneously consumed current may be reduced.

Second Embodiment

Figure 7:
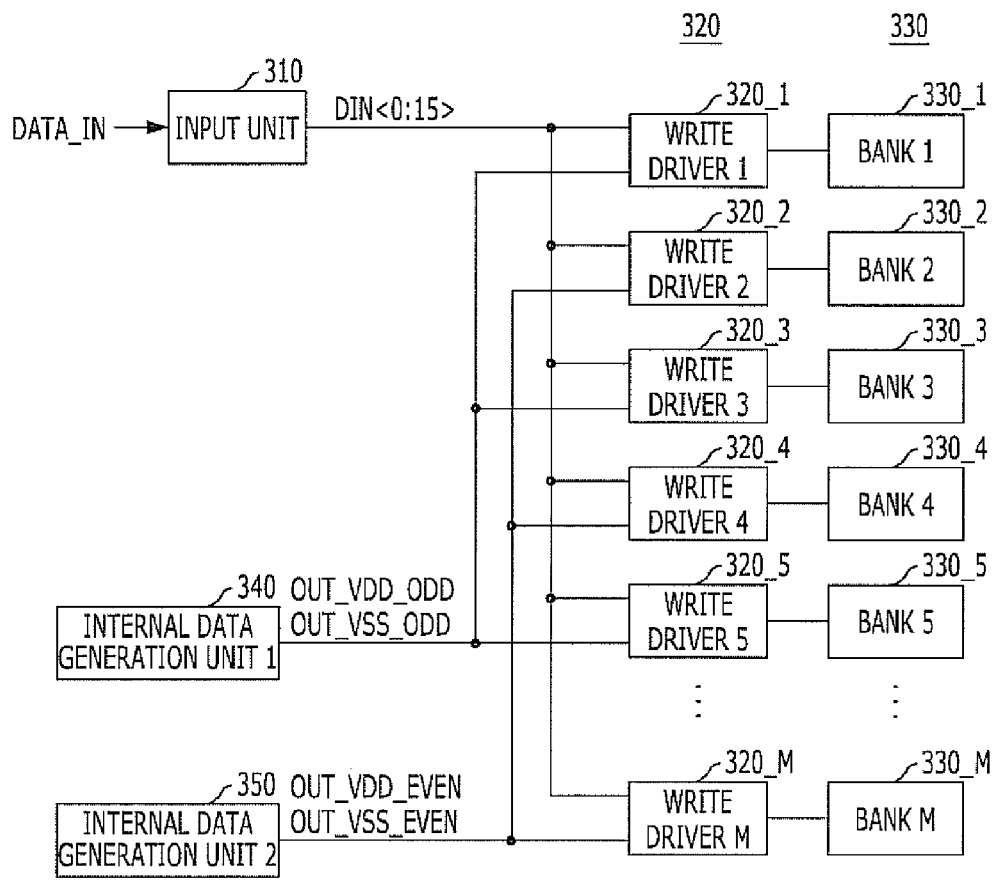
FIG. 7 illustrates a block configuration of a multi-test apparatus in accordance with another embodiment of the present invention.

FIG. 7 illustrates a block configuration of a multi-test apparatus in accordance with another embodiment of the present invention, which is a configuration included inside of each of the semiconductor chips 200_1 to 200_4 illustrated in FIG. 1. Each of the plurality of semiconductor chips 200_1 to 200_4 includes an input unit 310, a plurality of write drivers 320, a plurality of memory banks 330 and internal data generation units 340 and 350.

The input unit 310 receives data DATA_IN for testing from the test equipment 100 (illustrated in FIG. 1) and outputs test data DIN<0:15> to the plurality of write drivers 320. The input unit 310 includes an input buffer of a general semiconductor chip and receives the external test data DATA_IN through a data pad DQ The input unit 310 also performs a function of blocking the external test data DATA_IN from being provided to the plurality of write drivers 320.

The plurality of memory banks 330 include memory banks 330_1 to 330_M, and each of the memory banks 330_1 to 330_M includes a plurality of memory cells (not shown). The plurality of write drivers 320 include write drivers 320_1 to 320_M. The write drivers 320_1 to 320_M correspond to the respective memory banks 330_1 to 330_M and control the test data DIN<0:15> to be written in the memory banks 330_1 to 330_M by driving the memory banks 330_1 to 330_M, respectively.

The internal data generation unit includes a first internal data generation unit 340 and a second internal data generation unit 350, and the internal data generation unit generates internal test data OUT_VDD/OUT_VSS substituting for the external test data DATA_IN in response to a test control signal. The internal data generation unit provides the generated internal test data OUT_VDD/OUT_VSS to the write drivers 320_1 to 320_M in different time periods. Accordingly, the internal test data OUT_VDD/OUT_VSS is divided in two or more time periods and written in the memory banks 330_1 to 330_M.

The first internal data generation unit 340 generates internal test data OUT_VDD_ODD/OUT_VSS_ODD in a first time period T1 and provides the generated internal test data OUT_VDD_ODD/OUT_VSS_ODD to write drivers 320_1, 320_3, 320_5, 320_M−1 in a first group among the write drivers 320_1 to 320_M. As the write drivers 320_1, 320_3, 320_5, . . . , 320_M−1 in a first group are driven, the internal test data OUT_VDD_ODD/OUT_VSS_ODD is written in memory banks 330_1, 330_3, 330_5, . . . , 330_M−1 in a first group, respectively corresponding to the write drivers 320_1, 320_3, 320_5, . . . , 320_M−1 in the first group, among the memory banks 330_1 to 330_M.

The second internal data generation unit 350 generates internal test data OUT_VDD_EVED/OUT_VSS_EVEN in a second time period T2 different from the first time period T1, and provides the generated internal test data OUT_VDD_EVED/OUT_VSS_EVEN to write drivers 320_2, 320_4, . . . , 320_M in a second group among the write drivers 320_1 to 320_M. As the write drivers 320_2, 320_4, . . . , 320_M in the second group are driven, the internal test data OUT_VDD_EVED/OUT_VSS_EVEN is written in memory banks 330_2, 330_4, . . . , 330_M in a second, respectively corresponding to the write drivers 320_2, 320_4, . . . , 320_M in the second group, among the memory banks 330_1 to 330_M.

As described above, the memory banks in the first group may be odd-numbered memory banks 330_1, 330_3, 330_5, . . . , 330_M−1, and the memory banks in the second group may be even-numbered memory banks 330_2, 330_4, . . . , 330_M. Alternatively, the memory banks in the first or second group may be specified as memory banks having a number of banks (e.g., M/2) among the total of M memory banks.

Figure 8:
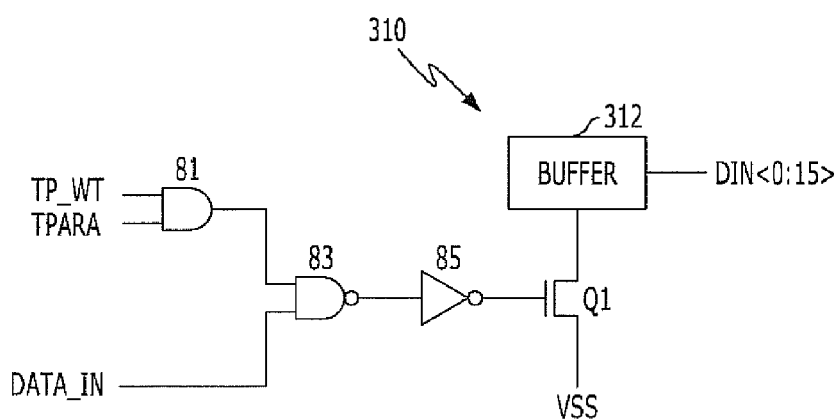
FIG. 8 illustrates a detailed configuration of an input unit illustrated in FIG. 7.

FIG. 8 illustrates a detailed configuration of the input unit 310 illustrated in FIG. 7. The input unit 310 includes a buffer 312, a transistor Q1, an AND gate 81, a NAND gate 83, and an inverter 85. The AND gate 81 receive test control signals TP_WT and TPARA inputted from the circuit outside of the input unit 310 and performs an AND gate operation on the received test control signals. Subsequently, the AND gate 81 outputs a signal obtained by performing the AND gate operation. The control signal TPARA is a control signal representing a general test mode of the multi-test, and the control signal TP_WT is a control signal representing a test mode using an internal test signal in the write driver. The NAND gate 83 receives the signal outputted from the AND gate 81 and the test data DATA_IN provided through the data pad DQ and outputs a signal obtained by performing a NAND gate operation on the output signal from the AND gate 81 and the test data DATA_IN. The inverter 85 receives the signal outputted from the NAND gate 83 and inverts the received signal. Subsequently, the inverter 85 outputs the inverted signal. The transistor Q1 is implemented as an NMOS transistor and has a gate terminal that receives the signal outputted from the inverter 84, a source terminal connected to a ground voltage terminal VSS, and a drain terminal connected to the buffer 312. The buffer 312 receives an input signal provided by the drain terminal of the transistor Q1 and buffers the received signal. Subsequently, the buffer 312 outputs the buffered signal. Through the circuit configuration described above, the buffer 312 blocks the external test data DATA_IN from being provided to the write drivers 320_1 to 320_M in response to the test control signals TP_WT and TPARA. For example, the buffer 312 blocks the external test data DATA_IN from being provided to the write drivers 320_1 to 320_M in response to a "high (H)" logic level of the control signals TP_WT and TPARA.

Figure 9:
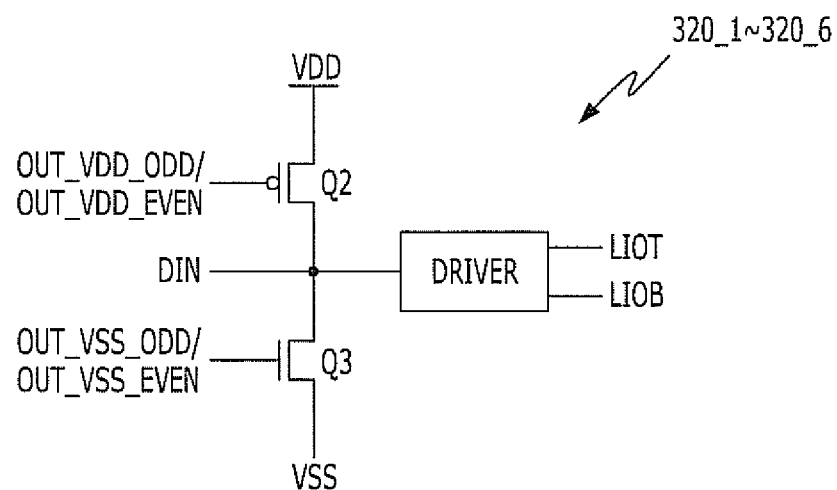
FIG. 9 illustrates a detailed configuration of write drivers illustrated in FIG. 7.

FIG. 9 illustrates a detailed configuration of the write drivers 320_1 to 320_M illustrated in FIG. 7. Each of the write drivers 320_1 to 320_M includes a driver and transistors Q2 and Q3. The driver receives test data DIN<0:15> provided from the input unit 310 and is connected to the memory banks 330_1 to 330_M through data lines LIOT and LIOB. The transistor Q2 is connected between a power voltage terminal VDD and an input terminal of the driver, and the gate of the transistor Q2 receives the internal test data OUT_VDD_ODD or OUT_VDD_EVEN provided from the internal data generation unit. The transistor Q3 is connected between the input terminal of the driver and a ground voltage terminal VSS, and the gate of the transistor Q3 receives the internal data OUT_VDD_ODD or OUT_VDD_EVEN provided from the internal data generation unit.

When internal test data OUT_VDD_ODD/OUT_VSS_ODD or OUT_VDD_EVEN/OUT_VSS_EVEN is applied at a "low (L)" logic level, the transistor Q2 is turned on, and the transistor Q3 is turned off. Accordingly, the driver provides the internal data of a "high (H)" logic level to the memory banks 330_1 to 330_M through the data lines LIOT and LIOB.

When the internal test data OUT_VDD_ODD/OUT_VSS_ODD or OUT_VDD_EVEN/OUT_VSS_EVEN is applied at a "high (H)" logic level, the transistor Q2 is turned off, and the transistor Q3 is turned on. Accordingly, the driver provides the internal data of the "Low (L)" logic level to the memory banks 330_1 to 330_M through the data lines LIOT and LIOB.

When the internal test data OUT_VDD_ODD or OUT_VDD_EVEN is applied at a "high (H)" logic level and the internal test data OUT_VSS_ODD or OUT_VSS_EVEN is applied at a "low (L)" logic level, the transistors Q2 and Q3 are both turned off. Accordingly, the driver provides the test data DIN<0:15> to the memory banks 330_1 to 330_M through the data lines LIOT and LIOB.

Figure 10:
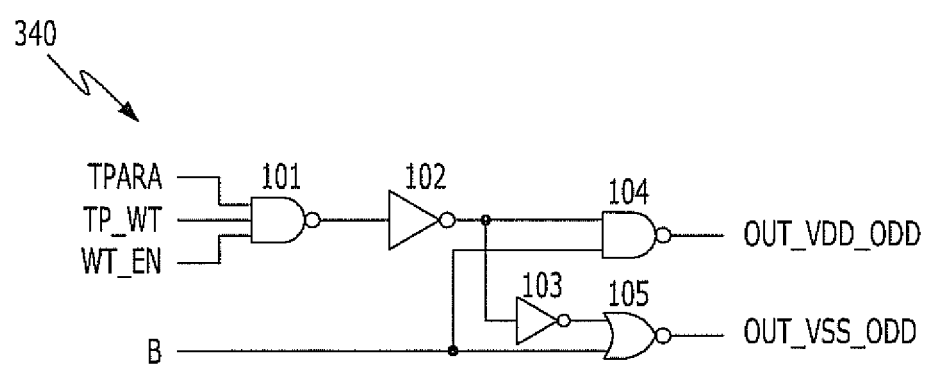
FIG. 10 illustrates a detailed configuration of a first internal data generation unit illustrated in FIG. 7.

FIG. 10 illustrates a detailed configuration of the first internal data generation unit 340 illustrated in FIG. 7. The first internal data generation unit 340 includes NAND gates 101 and 104, inverters 102 and 103, and a NOR gate 105. The NAND gate 101 receives test control signals TPARA and TP_WT and a write enable signal WT_EN and performs a NAND gate operation on the received control signals TPARA and TP_WT and write enable signal WT_EN. Subsequently, the NAND gate 101 outputs a signal obtained by performing the NAND gate operation. The inverter 102 inverts the signal outputted from the NAND gate 101 and outputs the inverted signal. The inverter 103 inverts the signal outputted from the inverter 102 and outputs the inverted signal. The NAND gate 104 receives the signal outputted from the inverter 102 and a data signal B and performs a NAND gate operation on the received signal outputted from the inverter 102 and data signal B. Subsequently, the NAND gate 104 outputs the internal test data OUT_VDD_ODD obtained by performing the NAND gate operation. The NOR gate 105 receives the signal outputted from the inverter 103 and the data signal B and performs a NOR gate operation on the received signal outputted from the inverter 103 and data signal B. Subsequently, the NOR gate 105 outputs the internal test data OUT_VSS_ODD.

When the test control signals TPARA and TP_WT and the write enable signal WT_EN are all applied at a "high (H)" logic level and the data signal B is applied at a "low (L)" logic level, the internal test data OUT_VDD_ODD is output at the "high (H)" logic level, and the internal test data OUT_VSS_ODD is output at the "high (H)" logic level. In this example, the write drivers 320_1, 320_3, 320_5, . . . , 320_M−1 in the first group, illustrated in FIG. 9, provide internal data at the "high (H)" logic level to the memory banks 330_1, 330_3, 330_5, . . . , 330_M−1 in the first group through the data lines LIOT and LIOB.

When the test control signals TPARA and TP_WT and the write enable signal WT_EN are all of applied at the "high (H)" logic level and the data signal B is applied at "high (H)" level, the internal test data OUT_VDD_ODD is output at the "low (L)" logic level, and the internal test data OUT_VSS_ODD is output at the "low (L)" level. In this example, the write drivers 320_1, 320_3, 320_5, . . . , 320_M−1 in the first group, illustrated in FIG. 9, provide internal data at the "low (L)" logic level to the memory banks 330_1, 330_3, 330_5, . . . , 330_M−1 in the first group through the data lines LIOT and LIOB.

When the test control signals TPARA and TP_WT and the write enable signal WT_EN are not all the "high (H)" logic level, the internal test data OUT_VDD_ODD is output at the "high (H)" logic level and the internal test data OUT_VSS_ODD is output at the "low (L)" logic level. In this example, the write drivers 320_1, 320_3, 320_5, . . . , 320_M−1 in the first group, illustrated in FIG. 9, provide the external test data DIN<0:15> to the memory banks 330_1, 330_3, 330_5, . . . , 330_M−1 in the first group through the data lines LIOT and LIOB.

Figure 11:
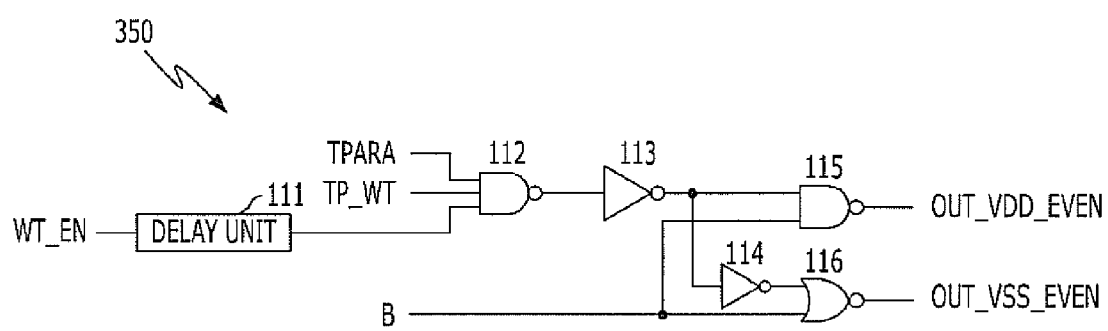
FIG. 11 illustrates a detailed configuration of a second internal data generation unit illustrated in FIG. 7.

FIG. 11 illustrates a detailed configuration of the second internal data generation unit 350 illustrated in FIG. 7. The second internal data generation unit 350 includes a delay unit 111, NAND gates 112 and 115, inverters 113 and 114, and a NOR gate 116. The delay unit 111 inverts a write enable signal WT_EN and outputs the inverted write enable signal. The NAND gate 112 receives test control signals TPARA and TP_WT and the write enable signal WT_EN delayed by the delay unit 111 and performs a NAND gate operation on the received control signals TPARA and TP_WT and write enable signal WT_EN. Subsequently, the NAND gate 112 outputs a signal obtained by performing the NAND gate operation. The inverter 113 inverts the signal outputted from the NAND gate 112 and outputs the inverted signal. The inverter 114 inverts the signal outputted from the inverter 113 and outputs the inverted signal. The NAND gate 115 receives the signal outputted from the inverter 113 and a data signal B and performs a NAND gate operation on the received signal outputted from the inverter 113 and data signal B. Subsequently, NAND gate 115 outputs the internal test data OUT_VDD_EVEN obtained by performing the NAND gate. The NOR gate 116 receives the signal outputted from the inverter 114 and the data signal B and performs a NOR gate operation on the received signal outputted from the inverter 114 and data signal B. Subsequently, the NOR gate 116 outputs the internal test data OUT_VSS_EVEN.

When the test control signals TPARA and TP_WT and the delayed write enable signal WT_EN are all applied at a "high (H)" logic level and the data signal B is applied at a "low (L)" logic level, the internal test data OUT_VDD_EVEN is output at the "high (H)" logic level, and the internal test data OUT_VSS_EVEN is output at the "high (H)" logic level. In this example, the write drivers 320_2, 320_2, . . . , 320_M in the second group, illustrated in FIG. 9, provide internal data of the "high (H)" logic level to the memory banks 320_2, 320_4, . . . , 320_M in the second group through the data lines LIOT and LIOB.

When the test control signals TPARA and TP_WT and the delayed write enable signal WT_EN are all applied at the "high (H)" logic level and the data signal B is applied at "high (H)" logic level, the internal test data OUT_VDD_EVEN is output at the "low (L)" logic level, and the internal test data OUT_VSS_EVEN is applied at the "low (L)" logic level. In this example, the write drivers 320_2, 320_2, . . . , 320_M in the second group, illustrated in FIG. 9, provide internal data of the "low (L)" logic level to the memory banks 320_2, 320_4, . . . , 320_M in the second group through the data lines LIOT and LIOB.

When the test control signals TPARA and TP_WT and the delayed write enable signal WT_EN are not all applied at the "high (H)" logic level, the internal test data OUT_VDD_EVEN is output at the "high (H)" logic level and the internal test data OUT_VSS_EVEN is applied at the "low (L)" logic level. In this example, the write drivers 320_2, 320_2, . . . , 320_M in the second group, illustrated in FIG. 9, provide the external test data DIN<0:15> to the memory banks 320_2, 320_4, . . . , 320_M in the second group through the data lines LIOT and LIOB.

Figure 12:
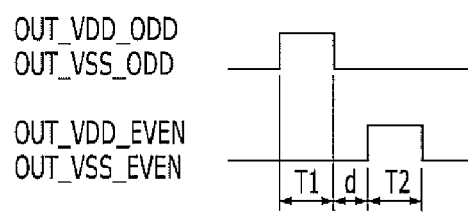
FIG. 12 is a timing diagram illustrating an operation of generating a write enable signal of a write control unit illustrated in FIG. 7.

FIG. 12 is a timing diagram illustrating an operation that generates write enable signals of the internal data generation units 340 and 350 illustrated in FIG. 7. The first internal data generation unit 340 generates first internal test data OUT_VDD_ODD/OUT_VSS_ODD in a first time period T1. The second internal data generation unit 350 generates second internal test data OUT_VDD_EVEN/OUT_VSS_EVEN in a second time period T2 after a certain time d elapses after the end of the first time period T1.

Figure 13:
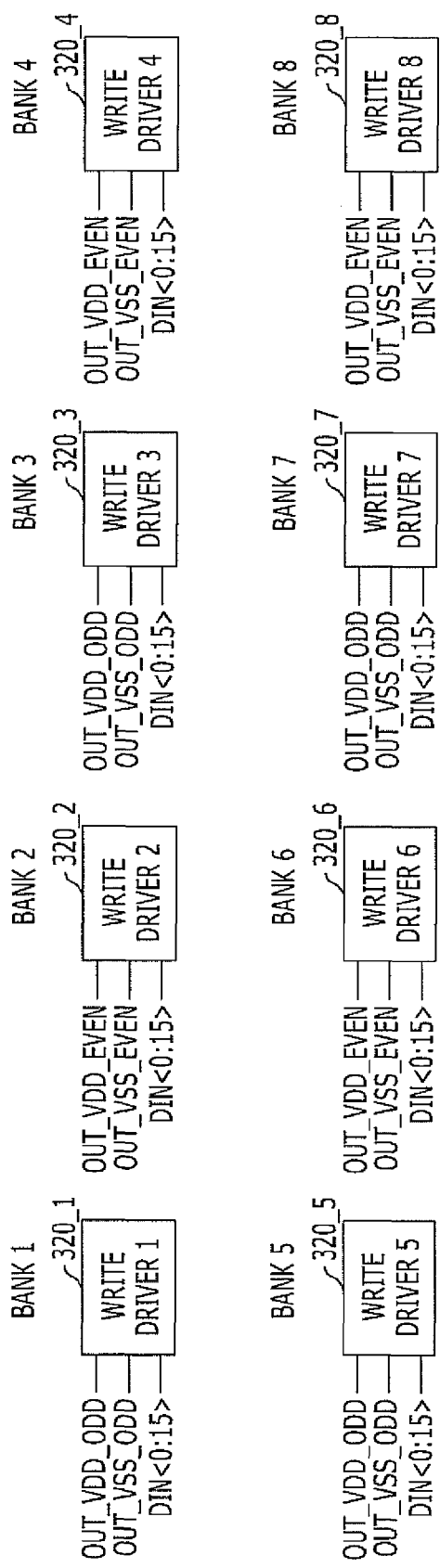
FIG. 13 illustrates memory banks that are selectively driven in a multi-test in accordance with the embodiment of the present invention.

FIG. 13 illustrates memory banks that are selectively driven in a multi-test in accordance with the embodiment of the present invention. The write drivers 320_1, 320_3, 320_5, . . . , 320_M−1 in the first group among the write drivers 320_1 to 320_M receive the first internal test data OUT_VDD_ODD/OUT_VSS_ODD substituting for the test data DIN<0:15> applied from the equipment 100 (illustrated in FIG. 1) in the first time period T1. The write drivers 320_1, 320_3, 320_5, . . . , and 320_M−1 in the first group control the first internal test data OUT_VDD_ODD/OUT_VSS_ODD to be written in the memory banks 330_1, 330_3, 330_5, . . . , 330_M−1 in the first group, respectively corresponding to the write drivers 320_1, 320_3, 320_5, . . . , 320_M−1 in the first group, among the memory banks 330_1 to 330_M.

The write drivers 320_2, 320_4, . . . , 320_M in the second group among the write drivers 320_1 to 320_M receive the second internal test data OUT_VDD_EVEN/OUT_VSS_EVEN substituting for the test data DIN<0:15> applied from the equipment 100 (illustrated in FIG. 1) in the second time period T2. The write drivers 320_2, 320_4, . . . , and 320_M in the second group control the second internal test data OUT_VDD_EVEN/OUT_VSS_EVEN to be written in the memory banks 330_2, 330_4, . . . , 330_M in the second group, respectively corresponding to the write drivers 320_2, 320_4, . . . , 320_M in the second group, among the memory banks 330_1 to 330_M. For example, the memory banks 330_1, 330_3, 330_5, . . . , 330_M−1 in the first group may be odd-numbered memory banks, and the memory banks 330_2, 330_4, . . . , 330_M in the second group may be even-numbered memory banks.

Thus, in this embodiment, the write drivers are not simultaneously driven in a multi-test of the semiconductor chips, and the driving of input units (buffers) is blocked not by blocking test data applied from the equipment 100 (illustrated in FIG. 1) but by generating internal data, so that instantaneously consumed current may be reduced.

As described above, according to the embodiments of the present invention, in a multi-test of semiconductor chips, write drivers are not simultaneously driven (the embodiment described with reference to FIGS. 2 to 6), or the write drivers and input units (buffers) are not simultaneously driven (the embodiment described with reference to FIGS. 7 to 13), so that instantaneously consumed current may be reduced. Further, the instantaneously consumed current is reduced, so that an excessive load being applied to test equipment as the instantaneously consumed current increases may be prevented.

Although the present invention has been described in connection with the specific embodiments, the embodiments of the present invention are only for illustrative purposes and should not be construed as limiting the scope of the present invention. For example, in the embodiments of the present invention, write drivers are divided and driven in two time periods, so that test data is selectively written in memory banks in the two time periods. However, the test data may be selectively written in the memory banks in two or more time periods.

In the embodiments of the present invention, a plurality of memory banks are divided into odd-numbered memory banks and even-numbered memory banks, and test data is written in the divided memory banks in different time periods from each other. However, the memory banks may be divided in different ways as long as the memory banks have a designated number in each group to obtain the same effect. Accordingly, it will be apparent to those skilled in the art that various changes and modifications may be made without departing from the spirit and scope of the invention as defined in the following claims.

What is claimed is:

1. A multi-test apparatus, comprising:
 a plurality of memory banks each including a plurality of memory cells;
 a plurality of write drivers corresponding to the respective memory banks;
 an input unit configured to receive first data for testing and provide the received first data to the plurality of write drivers; and
 an internal data generation unit configured to generate and provide second test data substituting for the first test data to a first group of write drivers and a second group of write drivers in different time periods, respectively, in response to a test control signal so that the second test data is written in a first group of the memory banks and a second group of memory banks corresponding to the respective write drivers groups in at least two different time periods, respectively, wherein the second group of write drivers does not include the write drivers of the first group,
 wherein the internal data generation unit comprises:
  a first internal data generation unit configured to generate the second test data and provide the generated internal test data to write drivers in the first group, respectively corresponding to memory banks in the first group, among the plurality of write drivers so that the internal test data is written in the memory bank in the first group among the plurality of memory banks in a first time period; and
  a second internal data generation unit configured to generate the second test data and provide the generated internal test data to write drivers in the second group, respectively corresponding to memory banks in the second group, among the plurality of write drivers so that the internal test data is written in the memory bank in the second group among the plurality of memory banks in a second time period after the first time period.

2. The multi-test apparatus of claim 1, wherein the input unit is configured to block the first test data from being provided to the plurality of write drivers in response to the test control signal.

3. The multi-test apparatus of claim 1, wherein consecutive memory banks are alternately in the first group and in the second group.

4. The multi-test apparatus of claim 1, wherein the first internal data generation unit is configured to generate the second test data and provide the generated second test data to the write drivers in the first group in response to the test control signal and a write enable signal.

5. The multi-test apparatus of claim 1, wherein the second internal data generation unit comprises a delay unit configured to delay the write enable signal and output the delayed write enable signal, and
 the second internal data generation unit is configured to generate the second test data and provide the generated internal test data to the write drivers in the second group in response to the test control signal and the delayed write enable signal.

6. The multi-test apparatus of claim 1, wherein the input unit is configured to receive the first test data inputted from test equipment that is outside of the multi-test apparatus that is connected to a plurality of semiconductor chips.

7. A test method of a multi-test apparatus comprising:
 receiving first test data inputted from test equipment and providing the received first test data to a plurality of write drivers;
 blocking the first test data from being provided to the plurality of write drivers in response to a test control signal; and
 generating and providing second test data to a first group of write drivers and a second group of write drivers in at least two different time periods, respectively, in response to the test control signal so that the second test data is written in a first group of memory banks and a second group of memory banks corresponding to the respective write drivers groups in the at least two time periods, respectively, wherein the second group of write drivers does not include the write drivers of the first group, wherein the writing of the internal test data comprises:

generating the second test data and providing the generated second test data to write drivers in the first group, respectively corresponding to memory banks in the first group, among the plurality of write drives so that the second test data is written in the memory banks in the first group among the plurality of memory banks in a first time period; and generating the second test data and providing the generated second test data to write drivers in the second group, respectively corresponding to memory banks in the second group, among the plurality of write drivers so that the second test data is written in the memory banks in the second group that does not include the memory banks in the first group among the plurality of memory banks in a second time period after the first time period.

8. The test method of claim 7, wherein consecutive memory banks are alternately in the first group and in the second group.

9. The test method of claim 8, wherein the second time period is after the first time period.

* * * * *